United States Patent
Clark et al.

(10) Patent No.: US 7,061,008 B2
(45) Date of Patent: Jun. 13, 2006

(54) SINGLE MOLECULE ARRAY ON SILICON SUBSTRATE FOR QUANTUM COMPUTER

(75) Inventors: Robert Graham Clark, Balgowlah Heights (AU); Andrew Steven Dzurak, Potts Point (AU); Steven Richard Schofield, Randwick (AU); Michelle Yvonne Simmons, Coogee (AU); Jeremy Lloyd O'Brien, Leura (AU)

(73) Assignee: Qucor Pty Ltd, Sydney (AU)

( * ) Notice: Subject to any disclaimer, the term of this patent is extended or adjusted under 35 U.S.C. 154(b) by 196 days.

(21) Appl. No.: 10/362,821

(22) PCT Filed: Aug. 24, 2001

(86) PCT No.: PCT/AU01/01057

§ 371 (c)(1),
(2), (4) Date: Aug. 28, 2003

(87) PCT Pub. No.: WO02/18266

PCT Pub. Date: Mar. 7, 2002

(65) Prior Publication Data
US 2004/0023519 A1 Feb. 5, 2004

(30) Foreign Application Priority Data
Aug. 30, 2000 (AU) ................ PQ9759

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ............... 257/14; 257/13; 257/31
(58) Field of Classification Search ......... 438/758, 438/795, 770, 778; 257/31, 14, 13, 65, 103
See application file for complete search history.

(56) References Cited

U.S. PATENT DOCUMENTS 5,932,484 A * 8/1999 Iwanaga et al. .......... 438/689
5,989,969 A * 11/1999 Watanabe et al. ......... 438/381
5,990,373 A * 11/1999 Klabunde ............... 588/313

(Continued)

FOREIGN PATENT DOCUMENTS

EP 567.985 A 11/1993

OTHER PUBLICATIONS

J. L. O'Brien et al., "towards the Fabrication of Phosphorus Qubits for a Silicon Quantum Computer", Physical Review B, vol. 64, Article 161401 (R),, American Physical Society, New York, Sep. 21, 2001.

(Continued)

Primary Examiner—Walter Lee Lindsay, Jr.
(74) Attorney, Agent, or Firm—Wood, Phillips, Katz, Clark & Mortimer

(57) ABSTRACT

Individual hydrogen atoms are desorbed from a hydrogen terminated layer on a silicon substrate, using an STM tip, to form a pattern of exposed regions. A single donor-bearing molecule (such as phosphorous atoms). The spins of the donor atoms may be used as qubits in a slid quantum computer.

4 Claims, 9 Drawing Sheets

U.S. PATENT DOCUMENTS

| | | | |
|---|---|---|---|
| 6,194,311 B1* | 2/2001 | Nakajima | 438/660 |
| 6,369,404 B1* | 4/2002 | Kane | 257/14 |
| 6,383,900 B1* | 5/2002 | Shimizu et al. | 438/488 |
| 6,472,681 B1* | 10/2002 | Kane | 257/14 |
| 6,492,283 B1* | 12/2002 | Raaijmakers et al. | 438/770 |
| 6,794,314 B1* | 9/2004 | Raaijmakers et al. | 438/778 |
| 2004/0029050 A1* | 2/2004 | Brenner et al. | 430/312 |
| 2004/0119061 A1* | 6/2004 | Wu et al. | 257/9 |
| 2004/0232353 A1* | 11/2004 | Jamieson et al. | 250/492.1 |
| 2004/0238813 A1* | 12/2004 | Lidar et al. | 257/31 |

OTHER PUBLICATIONS

J. R. Tucker et al., "Prospects for Atomically Ordered Device Structures", Solid-State Electronics, vol. 42, No. 7-8. pp. 1061-1067, Elsevier, Great Britain, 1998.

* cited by examiner

SINGLE MOLECULE ARRAY ON SILICON SUBSTRATE FOR QUANTUM COMPUTER

TECHNICAL FIELD

This invention concerns nanoscale products, such as electronic devices fabricated to nanometer accuracy. Such products could be useful in the fabrication of a quantum computer, but could have many other uses. In a further aspect the invention confirms a method of fabricating such products.

BACKGROUND ART

The Kane proposal[1,2] to fabricate a silicon-based quantum computer uses the nuclear spin of phosphorus nuclei ($I=\frac{1}{2}$) as the qubits embedded in isotopically pure $^{28}Si$ ($I=0$) (which is the same as high purity crystalline Si). At low temperatures the donor electron remains bound to the P nucleus and surface "A" gates control the hyperfine interaction between nuclear and electron spins, enabling polarization of the two. Coupling between adjacent donor electrons is achieved using separate surface "J" gates, enabling an electron mediated interaction between qubits. FIG. 1 shows this proposed structure.

In a 'bottom-up' approach individual phosphorus atoms are ordered with atomic accuracy in a silicon crystal using a combination of ultrahigh-vacuum (UHV) scanning tunneling microscopy (STM) and molecular beam epitaxy (MBE). The fabrication requirements of this 'bottom-up approach' to achieving the phosphorus in silicon device are: atomic placement of P atoms on a Si surface in an ordered array; encapsulation of these atoms by crystal growth of silicon followed by the growth of a barrier material such as $Si_xGe_{1-x}$ or $SiO_2$; registration of metal gates to the P atoms with electron beam lithography or other techniques; and a means to read-out the spin states of the computer[1,2].

In 1998 J. R. Tucker and T. C. Shen[3] described a new approach to future 3-dimensional device nanofabrication, which could if successful, realize practical control over electron transport in silicon and silicon-based heterostructures down to the atomic scale. The process envisioned consists of the following steps:

(1) STM-induced desorption of hydrogen atoms to expose bare silicon dangling bonds on an H-terminated surface;
(2) dosing with a few Langmuirs of $PH_3$, $AsH_3$, or $B_2H_6$ to deposit self-ordered arrays of dopant precursors onto the STM-exposed regions;
(3) low-temperature silicon overgrowth using techniques designed to limit dopant redistribution to the atomic scale;
(4) repetition to produce 3-dimensional electronic architectures.

Their paper shows the desorption of hydrogen atoms along lines of silicon dimers, and envisages that phosphine molecules (among others) could possibly self-order onto alternate sites along the lines.

Another independent proposal that specifically addresses the fabrication of a silicon-based nuclear spin quantum computer comes from N. S. McAlpine et al.[4] and A. S. Dzurak et al[5]. They propose strategies for the fabrication of multi-qubit devices that also employ a hydrogen-on-silicon resist technology in which a scanned probe is used to perform atomic-scale lithography. Subsequent fabrication steps include epitaxial silicon growth and electron-beam lithography. The same researchers have also disclosed the proposed fabrication scheme of FIG. 2.

The concept of using an STM to control surface reactions with adsorbed atoms and molecules goes back to 1995, when T. C. Shen et al.[6] demonstrated that it was possible to use an STM tip to desorb hydrogen from hydrogen terminated silicon (100) substrates. Using a multiple vibrational excitation technique with tunneling electrons at low applied voltages they proposed that single H atom desorption was possible. However their results showed that in general the high current densities employed often meant that both H atoms on a single silicon dimer were desorbed.

Dehuan Huang et al.[7] have also reported the use of an STM to manipulate single atoms on a surface. Using the Si(100)–2×1 surface and its hydrogen termination they fabricate an atomic chain of silicon dimers on an atomically flat insulating surface. They obtained STM images to show that the Si(100)–2×1 surface will have fewer defects when appropriate preparation is employed. They successfully prepared the monohydride Si(100)2×1:H surface using a dry etching process. Hydrogen atoms on the Si(100)2×1:H surface were extracted by applying both positive and negative voltage pulses between the STM tip and the sample surface with a certain tunneling current. This implies that the mechanism for extracting hydrogen atoms on the monohydride surface is due to not only electron excitation but also field evaporation. They saw a pairing effect, where hydrogen atoms tended to come off in pairs from the underlying silicon dimers. Using this technique, they fabricated a Si dimer chain on the Si(100)–2×1:H surface by removing pairs of hydrogen atoms through application of 3 pulses of 8 V each for 50 ms to the sample under a constant current (2 nA) condition.

In 1997 Joseph W Lyding[8] produced a brief review of scanned probe nanofabrication, followed by an in-depth discussion of UHV STM nanofabrication on hydrogen passivated silicon surfaces. Again the UHV STM functions as a nanolithography tool by selectively desorbing areas of hydrogen from silicon surfaces. At higher sample voltages direct electron stimulated desorption occurs, whereas, at lower voltages, vibrational heating of the Si—H bond leads to desorption. The chemical contrast between clean and H-passivated silicon enables a wide variety of spatially selective nanoscale chemical reactions. Results are presented in which these templates are used for selective oxidation, nitridation, and metallization by chemical vapor deposition. Selective nitridation has been accomplished by treating the STM patterned surface with $NH_3$.

In 1998 T. Hitosugi et al[9]., also presented a scanning tunneling microscopy/spectroscopy (STM/STS) study of atomic-scale dangling-bond (DB) wires on a hydrogen-terminated Si(100)2×1:H surface. To desorb hydrogen atoms on the Si(100)2×1:H surface an STM tip was first positioned above the selected atom. Then a pulse voltage of $V_s=+2.9$ V and tunneling current of $I_t=400$ pA were applied. The pulse duration time ranged from 100 to 300 m/s.[9] In such cases, DB wires of one or two dimers wide (0.8–1.6 nm) were obtained. In the case of DB wires made of paired DBs, the STS shows semiconductor electronic states with a band gap of approximately 0.5 eV. They succeeded in making an atomic-scale wire that has a finite density of good agreement with a recent first-principles theoretical calculation.

Another experiment in 1998 by K. Stokbro et al.[10] reports STM-induced desorption of H from Si(100)–(2×1):H at negative sample bias. The desorption rate exhibits a power-law dependence on current and a maximum desorption rate at −7 V. The desorption is explained by vibrational heating of H due to inelastic scattering of tunneling holes with the Si—H 5 σ hole resonance. The desorption experiments were carried out by scanning the STM tip at speed, s, sample bias, $V_b$, and tunnel current, I, and subsequently imaging the affected area to determine the number of Si sites where desorption occurred.

A single line of H is desorbed from the Si(100)–H(2×1) surface as a result of a line scan at −7 V and 3.0 nA.

Other nanoscale hydrogen desorption of the Si(100)–2×1 hydrogen terminated surface using a UHV STM has been reported by C. Syrykh et al.[11] in 1999. Here they have studied the patterned linewidth as a function of the sample bias and the dose, either with the feedback servo loop on or off. They present results showing an array of eighteen local desorbed regions by applying pulses with 4 V amplitude and durations of 1 ms. The diameter Φ of the H-desorbed region is less than 3 nm.

Hydrogen lithography at the nanometer linewidth scale has been used for the spatially selective adsorption of atoms and molecules such as oxygen[12], ammonia[12], iron[13], aluminium[14], gallium[15] and cobalt[16], and more recently atomic scale lithography has been used for the adsorption of individual and clusters of silver atoms[17].

Despite the intense interest in H-resist lithography there has been no systematic study of controlled, atomically precise desorption of single H-atoms in silicon for the fabrication of an array of dopant bearing molecules for a subsequent nanoscale electronic device.

SUMMARY OF THE INVENTION

The invention is a nanoscale product, comprising:

An array of single phosphorus bearing molecules adsorbed onto a hydrogen patterned crystalline silicon surface; where the hydrogen patterned crystalline silicon surface comprises a mono layer of hydrogen with one hydrogen atom bonded to each silicon atom (a mono-hydride layer) from which hydrogen atoms have been singly desorbed to expose regions for the single phosphorous bearing molecule to adsorb onto.

For instance, single H atoms may be desorbed from the Si(100):H surface in a controlled manner to expose less than or equal to two silicon dimers such that single phosphorus bearing molecules can adsorb to the exposed underlying silicon dangling bond site.

FIGS. 6(b) and (f) show such a device for the first time, and here the array is linear.

According to a further aspect, the invention is a method of fabricating a nanoscale product as defined above, comprising the following steps:

(a) preparing a sample Si(001)2×1 surface in an ultra-high-vacuum environment by:

(i) outgassing the samples for 6 hours at ~600° C. by indirect heating such as using a resistive heating element mounted behind the sample holder, (ii) flashing the samples to ~1200° C. for ~1 minute by passing a DC current directly through the sample, during which time pressure remains in the low $10^{-10}$ mbar region, (iii) reducing the sample temperature to ~950° C. and then cooling slowly from ~950° C. to room temperature;

(b) passivating the sample surface with atomic hydrogen in the same ultra-high-vacuum environment, the dose rate being controlled by monitoring the total pressure of the vacuum system to achieve hydrogen termination of the surface, being a mono layer of hydrogen with one hydrogen atom bonded to each silicon atom (mono-hydride dimer);

(c) selectively desorbing single H atoms from the passivated surface using an STM tip in the same ultra-high-vacuum environment, by applying pulses of both high voltage and tunneling current to the tip for a short time period of the order 1 ms, to form a pattern in the hydrogen layer;

(d) exposing the surface to phosphine ($PH_3$) molecules in the same ultra-high-vacuum environment, such that the phosphine molecules bond to the exposed pattern in the surface.

Specifically this process forms the first process stage of producing an atomic array of phosphorus atoms in silicon with the controlled separation for a phosphorus in silicon quantum computer. Such a solid-state quantum computer may use either the electron spin[18] or nuclear spin of phosphorus nuclei (I=½) as the qubits embedded in isotopically pure $^{28}Si(I=0)$.

The distance between hydrogen desorption sites is less than the required qubit spacing of 20 nm, and a series of single desorption sites in a line >100 nm in length have been produced.

In a further aspect the invention is a quantum computer involving the use of the nuclear spin or electron spin of donor atoms such as phosphorus nuclei (I=½) as the qubits embedded in isotopically pure $^{28}Si(I=0)$, the computer including:

A Si(001)2×1 substrate into which single donor bearing molecules such as phosphorous bearing molecules have been adsorbed through respective windows in a resist, being a mono layer of hydrogen, to create an array, where each window is sized by the desorption of hydrogen to permit only one donor bearing molecule such as phosphine to adsorb to the silicon at that site. These sites are separated from each other by any desired spacing, such as that required for the wave functions of adjacent pairs of donor electrons at these sites to overlap.

BRIEF DESCRIPTION OF THE DRAWINGS

An example of the invention will now be described with reference to the accompanying drawings, in which:

FIG. 3(a) is a vicinal silicon surface with a miscut angle ~0.2°. This surface has 5 flat (001) terrace regions, separated by monatomic steps edges. The image was acquired with a sample bias of −2 V and a set point current of 0.2 nA. FIG. 3(b) is a 17×24 nm², completely defect free region of a Si(001)2×1 surface. This image was acquired at with a −1.0 V sample bias and a 0.4 nA set point current.

BEST MODES OF THE INVENTION

In Kane's proposed architecture for a silicon based quantum computer two P donors need to be ~20 nm apart to allow the adjacent donor electron wavefunctions to overlap. A layer of epitaxial Si encapsulates the P atoms and an insulating barrier provides electrical isolation between the P atoms and the gates. A scaleable device design requires the fabrication of an array of P atoms in precise locations within a Si crystal. This invention demonstrates the first critical step in producing such an array.

Figure 1:
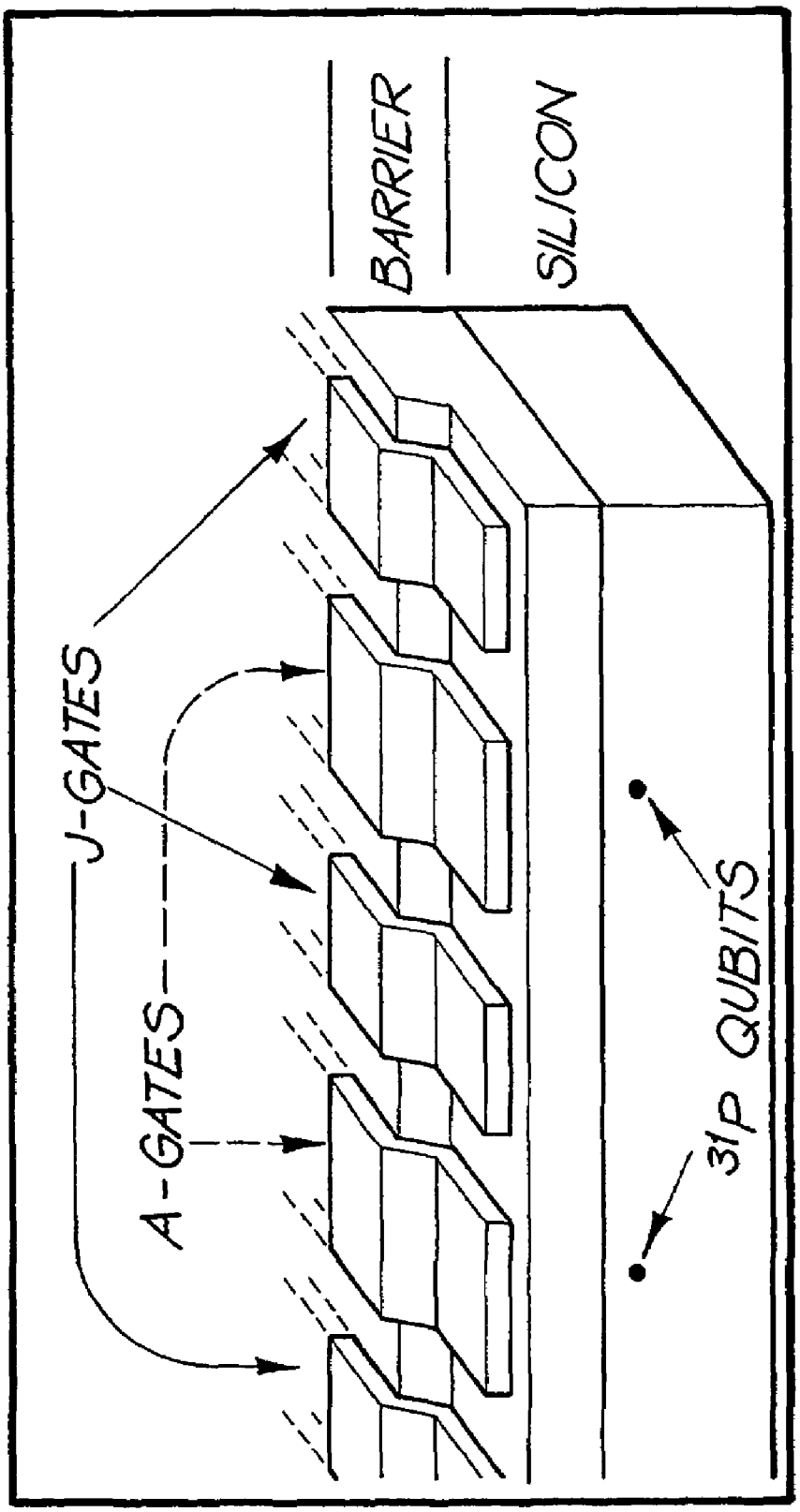
FIG. 1 is a schematic of Kane's (known) proposed architecture for asiin based quantum computer, showing two phosphorus atoms incorporated into isotopically pure $^{28}Si$ with surface metal gates separated by an insulating barrier.

Atomic scale manipulations of metal atoms on metal surfaces has been achieved using a STM tip to move individual atoms, however, such techniques are highly problematic for moving P atoms on a Si surface, since P is known to bond strongly to Si. An alternative strategy must therefore be adopted for fabricating the device, shown in FIG. 1.

Figure 2:
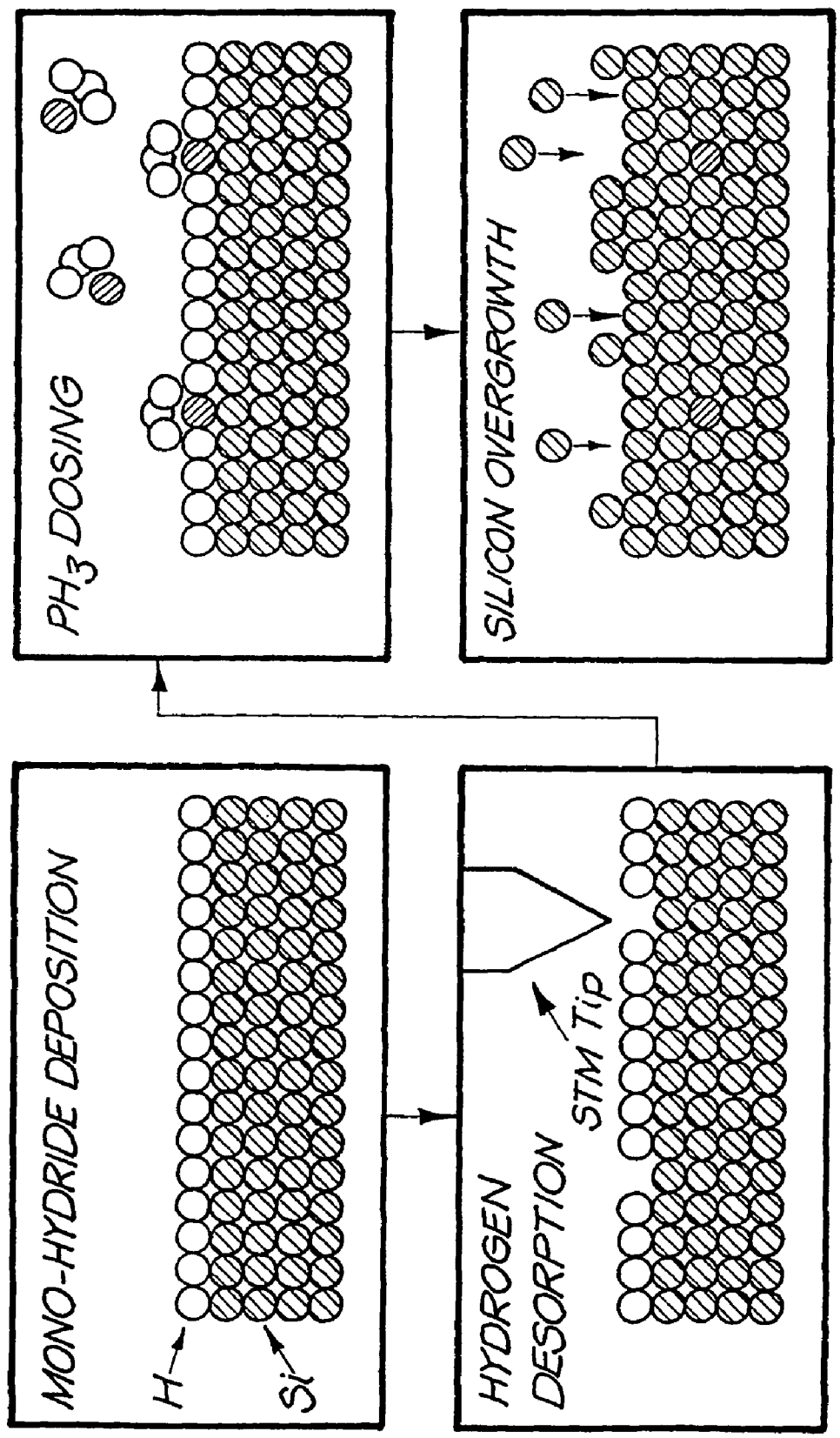
FIG. 2 is a schematic of McAlpine et al's known conceptual process to fabricate the structure shown in FIG. 1. An STM tip is used to selectively desorb H with atomic resolution and $PH_3$ molecules then bond only to these sites. P atoms are then encapsulated in crystalline Si followed by an insulating barrier.

FIG. 2 outlines the individual processing steps for this alternative fabrication strategy. A clean Si(001)2×1 surface is formed in an ultra-high-vacuum (UHV) by heating to near the melting point. This surface has a 2×1 unit cell relative to the 1×1 unit cell of an unreconstructed surface and consists of rows of σ-bonded Si dimers with the remaining dangling bond on each Si forming a weak π-bond.

Exposure of this suface to atomic H can break the weak Si π-bonds, allowing H atoms to bond to the Si dangling bond. Under controlled conditions a monolayer of H can be formed with one H atom bonded to each Si atom, satisfying the reactive dangling bonds, effectively passivating the surface.

An STM tip is then used to selectively desorb H atoms from the passivated surface by the application of appropriate voltages, forming a pattern in the H resist. In this way regions of bare, reactive Si are exposed allowing the subsequent adsorption of reactive species directly to the Si surface.

Phosphine ($PH_3$) gas is introduced into the vacuum system via a controlled leak valve to a specially designed phosphine micro-dosing system. The phosphine molecule bonds strongly to the exposed Si(001)2×1 surface through the holes in the hydrogen resist. Subsequent heating of the STM patterned surface for crystal growth displaces the H and incorporates the P into the first layer of Si. It is therefore the exposure of an STM patterned H passivated surface to $PH_3$ that is used to produce the required P array.

There are a number of challenges to be met in this fabrication scheme. In all of the processes outlined above, introduction of charge and spin impurities is likely to be fatal to the operation of the quantum computer. Preparation of large areas of defect free Si(001)2×1 on which to fabricate the P array is necessary. It is also essential to produce a complete coverage of the Si surface with H with controlled desorption so that $PH_3$ adsorbs only at the desired sites. A detailed description of how each of these challenges has been met is described below.

Preparation of Low Defect Density Surface

The (001) surface is the most stable and well understood surface of silicon, and as such was chosen as the most suitable candidate on which to attempt placement of an atomically precise phosphorus array for fabrication of the Kane quantum computer.

The system used in this work is a three chamber Omicron UHV variable temperature (VT) STM multiprobe RM system. For the surface passivation stage an atomic hydrogen source is attached to the analysis chamber, consisting of a tungsten filament, water cooled heat shroud and controlled leak valve. Phosphine gas is introduced to the chamber via a controlled UHV leak valve and double containment gas lines.

A separate chamber within the same vacuum environment houses a commercial silicon deposition cell. This instrument allows for surface preparation, placement of phosphorus arrays and subsequent silicon overgrowth all within the one UHV environment.

Silicon samples of 3.5×10 $mm^2$ dimensions were cleaved from commercially available phosphorus doped n-type silicon wafers with resistivities of 1–10 Ωms for use in Omicron direct heating STM sample holders. The sample surfaces were prepared under UHV conditions by following a standard thermal preparation procedure[19] involving the following steps: (i) The samples were outgassed for 6 hours at ~600° C. by indirect heating using a resistive heating element mounted behind the sample holder. (ii) The samples were flashed to ~1200° C. for 1 minute by passing a DC current directly through the sample. This step removes the native oxide layer from the surface and allows the surface silicon atoms to become mobile. (iii) The sample temperature was reduced to ~950° C. and then cooled slowly from ~950° C. to room temperature. It was found that the surface defect density was strongly dependent on the final cool down rate, as has been reported previously[20]. The sample temperature was monitored throughout this procedure using an infrared pyrometer. After the initial outgassing, the pressure in the vacuum chamber remains in the low $10^{-10}$ mbar region or lower (including during flashing to 1200° C.)

Figure 3:
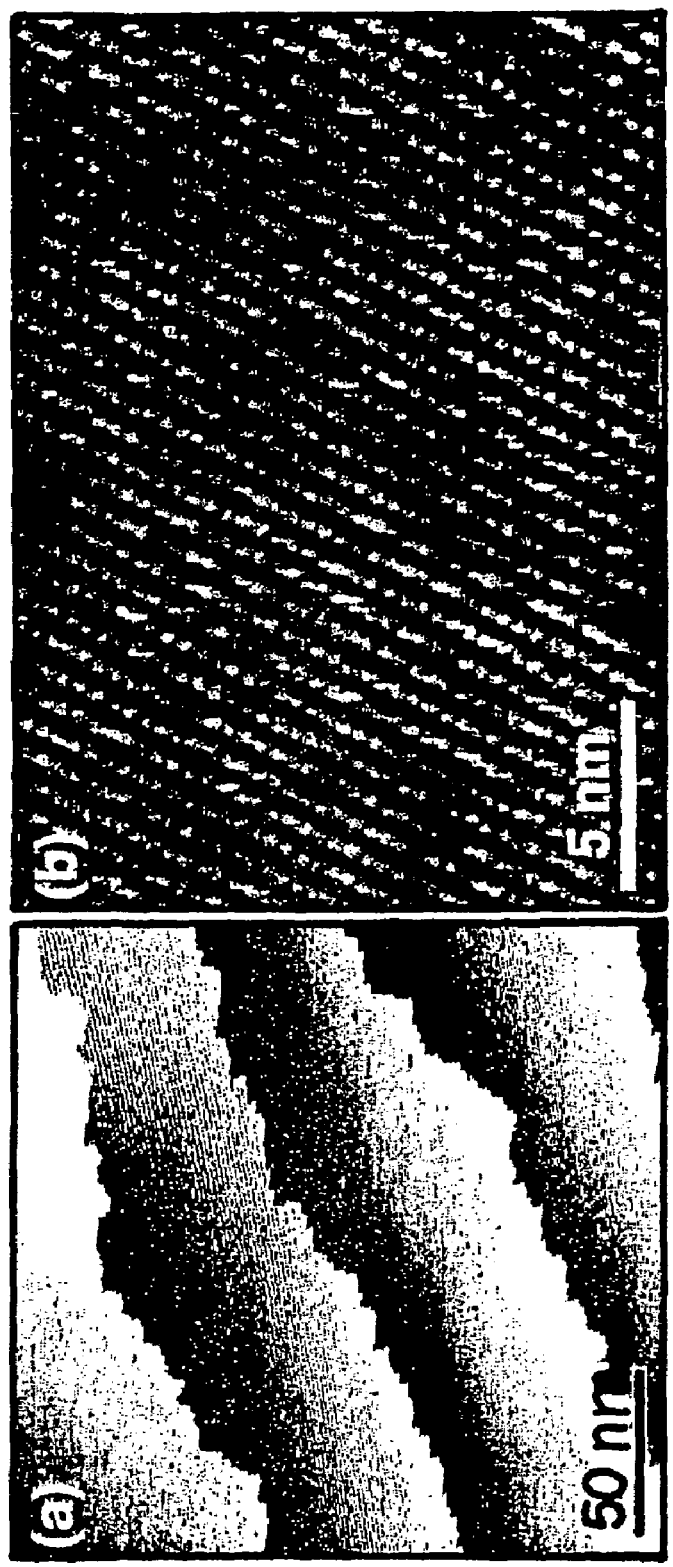
FIG. 3 shows STM images of a clean, very low defect Si(001)2×1 surface.

FIG. 3(a) shows a typical STM image of a low defect density Si(001)2×1 surface, prepared according to the above procedure, where five monatomic steps are visible. These steps exist because of a slight misorientation of the surface plane with respect to the (001) crystal direction. The angle of this misorientation for the surface shown in FIG. 3(a) is ~0.2°, giving an average spacing between steps of ~400 Å. It is not possible to produce a completely defect free surface[20], however, the defect density of the surface shown in FIG. 3(a) is approximately 1% which is consistent with the lowest defect density surfaces reported in the literature (eg., Ref. 20). FIG. 3(b) shows a higher resolution image where individual surface dimers can be resolved, and highlights a 17×24 nm$^2$ area of the surface that is entirely defect free. This image was acquired with a negative sample bias and as such is a filled state image with the dimers appearing as the usual bean shaped protrusions attributed to tunneling from the π bond of the dimer[21].

Hydrogen Resist

The next stage of the fabrication procedure is to passivate the Si(001)2×1 surface with hydrogen. In order to do this we use an atomic hydrogen source (AHS). The AHS filament is heated to 1500° C. and a source of 99.999% pure molecular hydrogen is passed through the AHS via a controlled leak valve into the UHV chamber. The AHS converts a significant fraction of the molecular hydrogen to atomic hydrogen, and the atomic hydrogen then reacts with the sample surface, forming the passivation layer. The dose rate is controlled by monitoring the total pressure of the vacuum. The purity of the gas being introduced to the chamber is monitored using a mass spectrometer.

Due to the very weak nature of the silicon dimer π bond, the Si(001)2×1 surface is very reactive. Hydrogen atoms impinging onto the Si(001)2×1 surface break the weak dimer π bond, creating two reactive surface sites where hydrogen atoms may adsorb. A dimer with only one H atom adsorbed is called a hemihydride dimer. The silicon atom of the dimer that is not hydrogen terminated is left with a dangling bond where a second hydrogen atom may adsorb. A silicon dimer that has been completely passivated with two hydrogen atoms is called a monohydride dimer.

Figure 4A:
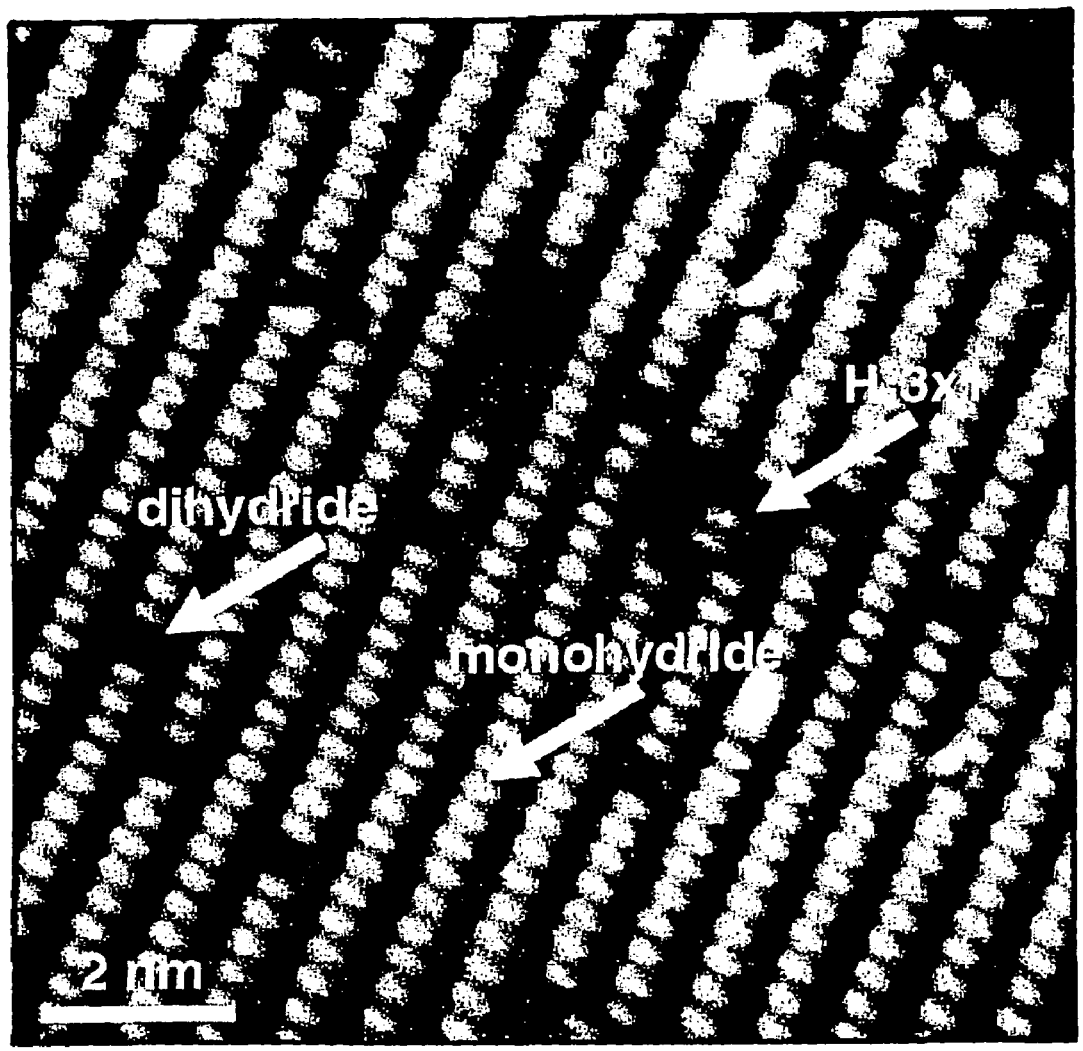
FIG. 4(a) is an image of near monolayer coverage of H on Si(001) surface. Sites of monohydride, dihydride and a combination of these two phases, known as the H:(3×1) phase are identified and shown schematically in FIGS. 4(b–d). Scanning tunneling spectroscopy, shown in FIG. 4(e) gives a clear signature of a H-terminated surface when compared with that of a clean surface, shown in 3(b).
Figure 4B:
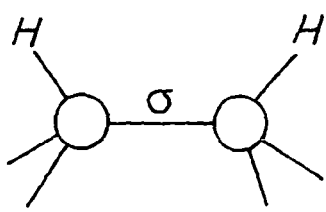
Figure 4C:
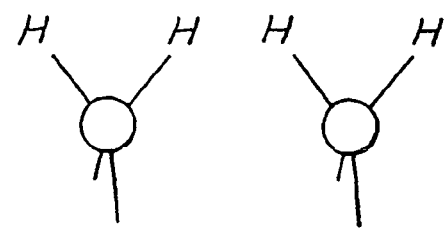
Figure 4D:
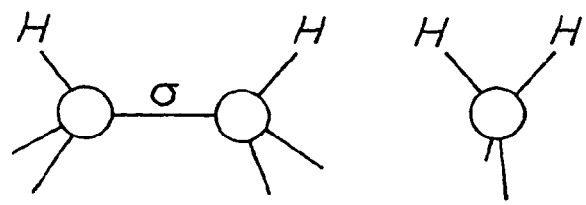
Figure 4E:
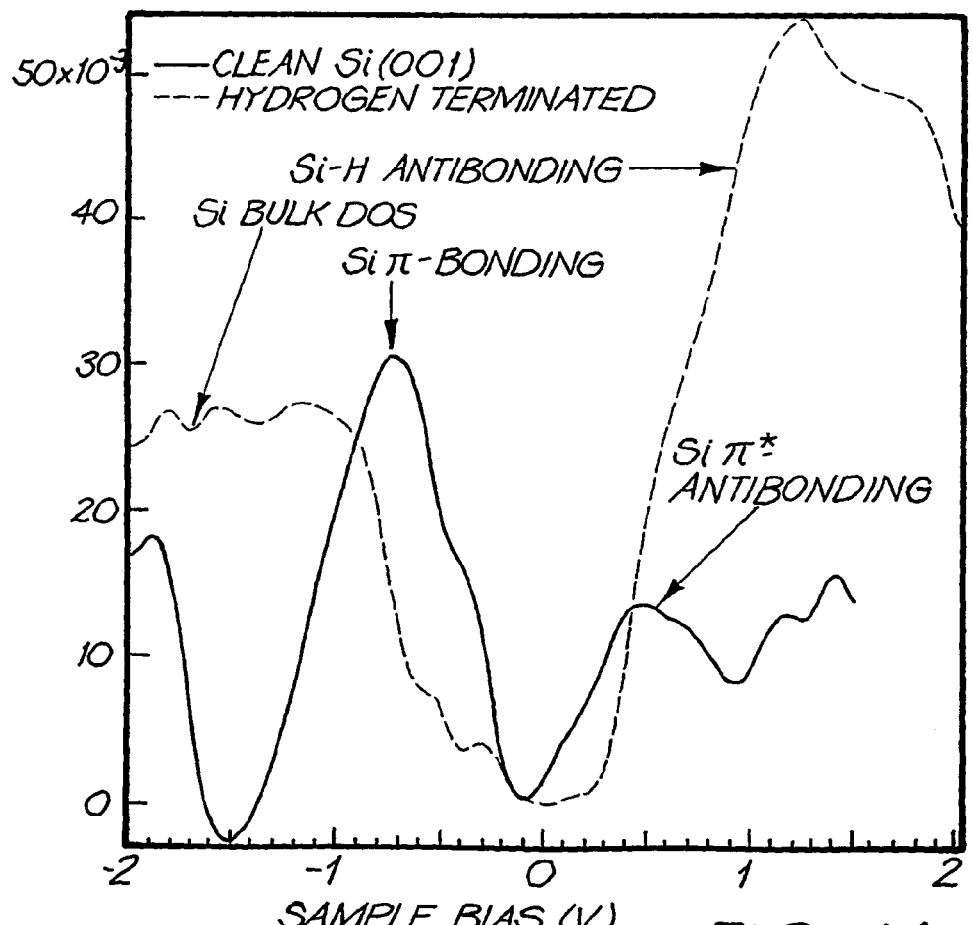

Several experiments were performed to determine the optimal hydrogen dosing conditions to obtain a uniform monohydride layer. FIG. 4 is an example of a passivated surface where we have dosed the sample to a chamber pressure of 10$^{-7}$ mbar for half an hour with sample temperatures in the range of 300–400° C. During dosing the sample surface was positioned directly in front of the AHS UHV inlet at a distance of ~10 cms. The result of dosing a sample at between 300–400° C. is shown in FIG. 4(a). In this particular experiment too much hydrogen was deliberately allowed into the chamber such that areas of di-hydride and a mixture of these phases (known as the (3×1):H phase also formed. FIGS. 4(b–d) show schematically the difference between the monohydride (b), dihydride (c) and the (3×1):H phase (d). FIG. 4 demonstrates that we are able to controllably dose the Si(001) surface with hydrogen and identify the resultant surface species, such that it is possible to systematically obtain a uniform monohydride layer. However, to further demonstrate our ability to characterise the clean and hydrided surfaces we have performed a number of scanning tunneling spectroscopy (STS) experiments[22]. We held the STM tip at a fixed location and distance from the surface (by disengaging the STM tip feedback mechanism) and ramped the tip bias through −2 V to 2 V, while measuring the tunnel current. FIG. 4(e) shows the results of these STS experiments for both the clean and hydrogen terminated surfaces. The clean surface spectroscopy shows both the π bonding and π* antibonding peaks. The spectroscopy for the hydrogen terminated surface shows a broad shoulder associated with the silicon bulk density of states and a pronounced Si—H antibonding peak. Both of these results are in agreement with previous studies[22].

Hydrogen Lithography

Following the formation of a monolayer of H on the Si surface the next step is to selectively desorb regions in the H resist using the STM tip. This will expose areas of the Si surface for the controlled placement of P atoms.

Achieving atomic resolution desorption places stringent requirements on the STM tip. Controlled desorption can be achieved by applying a large bias to the STM tip, however, it is also possible to desorb hydrogen whilst imaging, thereby exposing regions of the surface unintentionally. We demonstrate that we have overcome this obstacle to controllably and repeatedly desorb H in an array suitable for the fabrication of the Kane quantum computer.

In order to achieve atomic resolution desorption[6] a very sharp tungsten tip with a large cone angle is required[24]. In order to meet these requirements we have used a commercial tip etching device (Omicron W-Tek Semi-Automatic Tip Etching system). A length of W wire (diameter=0.38 mm) is inserted ~2 mm into a NaOH solution at the centre of a stainless steel cathode ring. Application of ~5–10 V between electrodes generates an electrochemical reaction which proceeds preferentially at the surface of the solution. Within ~10 min the wire is etched completely through leaving a small radius tip. A 2 min etch in hydrofluoric acid removes any oxide layer. The tip is inspected under an optical microscope to assess the geometry and, if satisfactory, loaded into the UHV system within 30 min to prevent formation of oxide. Other tip materials can be used such as PtIr and will be subject to similar preparation considerations.

An STM tip is used to desorb hydrogen from the surface by application of a controlled voltage pulse between the tip and sample[6-17]. Careful optimisation of the geometry of the tungsten tip and controlled voltage pulses (sample bias ~6 V and tunneling current ~1 nA for ~1 ms) makes atomic resolution desorption possible.

Figure 5:
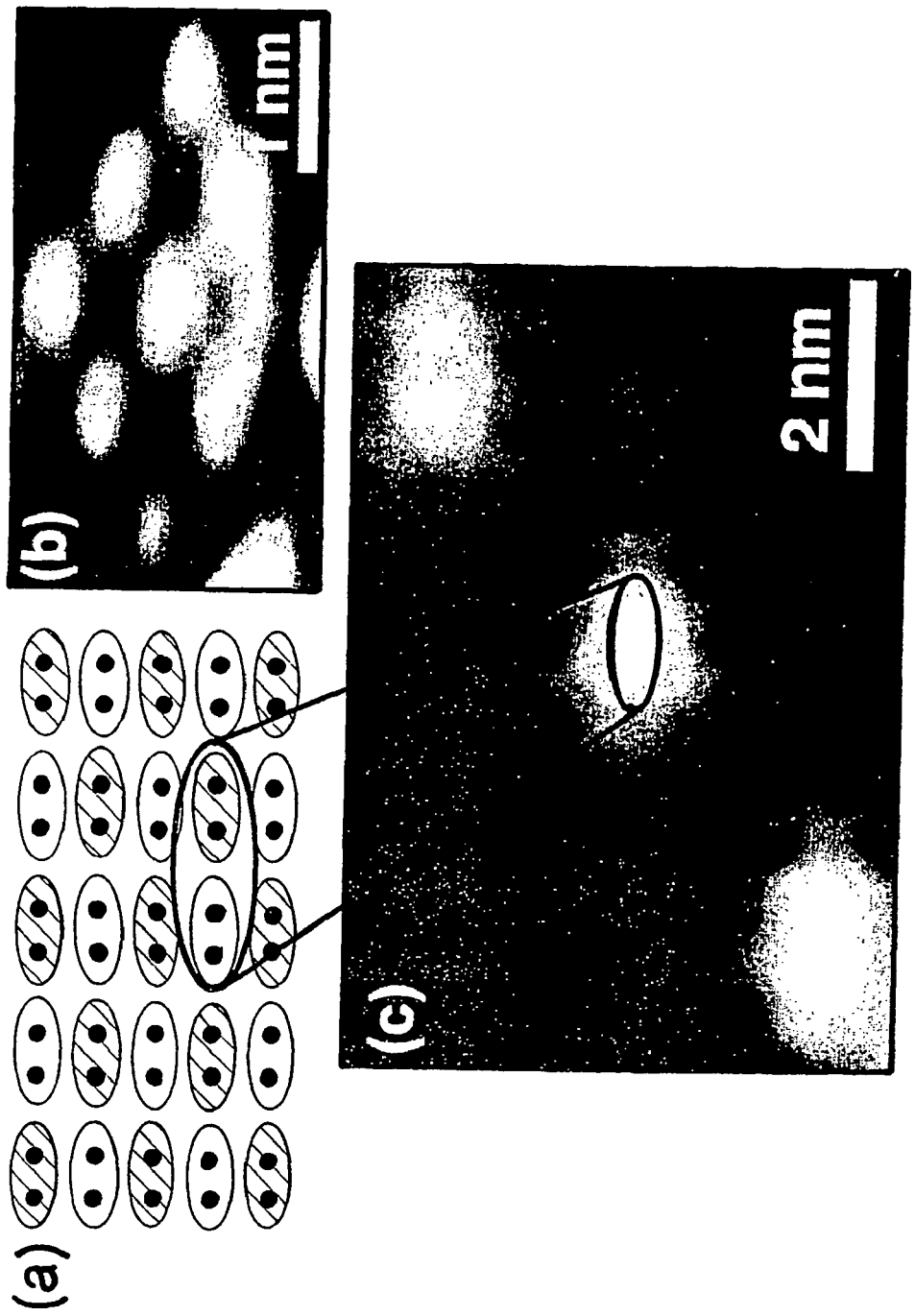
FIG. 5(a) is a schematic of the c(4×2) structure of $PH_3$ on the Si(001)2×1 surface, where shaded dimers indicate possible $PH_3$ bonding sites.
FIG. 5(b) shows an STM image of the c(4×2) structure on the $PH_3$ dosed Si(001)2×1 surface where the bright protrusions correspond to the shaded regions in (a). This image was acquired at a sample bias of −3.0 V and tunneling current 0.2 nA. 5(c) is an STM image of three hydrogen desorption sites on a mono-hydride Si(001)2×1:H surface. Removal of hydrogen atoms from this surface exposes the silicon dangling bonds so that exposed silicon regions appear as bright protrusions in the STM image. The highlighted regions in (a) and (c) compare the dimensions of a hydrogen desorption site with respect to the c(4×2) structure, indicating that only one phosphine molecule can adsorb at that site.

In order to allow the adsorption of one phosphine molecule, and therefore only one phosphorus atom, it is necessary to desorb an area that exposes less than or equal to two silicon diniers as shown schematically in FIG. 5a. This is because phosphine bonds to the Si(001)2×1 surface with a c(4×2) surface periodicity as demonstrated in FIG. 5b where we have dosed a clean Si(001)2×1 surface with phosphine[25]. The STM image in FIG. 5c shows three <1 nm diameter hydrogen desorption sites in a row with a pitch of ~4 nm on a hydrogen terminated Si(001)2×1 surface. This image, with such a close spacing between sites, highlights the atomic resolution desorption achieved. The distance between sites can easily be increased to the required qubit spacing of 20 nm, and we have performed controlled lithography of single desorption sites in a line >100 nm in length. The desorption sites in FIG. 5c appear as bright protrusions as a result of the extension of electron density out of the surface due to the silicon dimer surface states of the exposed silicon dangling bonds[6-11]. FIG. 5 demonstrates that these desorption sites are sufficiently small to allow only one phosphine molecule to bond to the surface at each site.

Phosphorus Array

The next step is to fabricate the P arrays. Following STM lithography to expose small regions of the Si(001)2×1 surface phosphine gas is permitted into the chamber by a controlled leak valve such that individual phosphorus bearing molecules are adsorbed onto the exposed silicon surface.

In order to obtain high purity phosphine gas delivery, the PH$_3$ micro-dosing system and its connections to the UHV STM employed internally electro-polished gas lines assembled in a clean-room environment. Mass spectra taken in the chamber during the exposure at a pressure of 10$^{-8}$ mbar reveal no significant increase in the partial pressure of any other species. The sticking coefficient of phosphine on the clean silicon surface is 1 (Ref. 26).

Figure 6A:
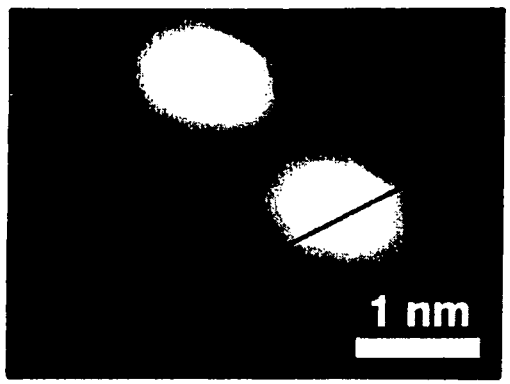
FIGS. 6 shows STM images of two desorption sites along a silicon dimer row before (a), and after (b), phosphine dosing. The corresponding line profiles (c and d) show a characteristic height difference of ~0.05 nm as the phosphine molecule adsorbs to the exposed dangling bond sites. Additionally three desorption sites, this time perpendicular to the silicon dimer row direction, are shown before (e), and after (f) phosphine dosing with corresponding line profiles (g,h). The line profiles again highlight the characteristic height increase of 0.05 nm at the phosphine molecule adsorption sites. All images were acquired at a sample bias of −1.8 V and tunneling current of 0.4 nA.
Figure 6B:
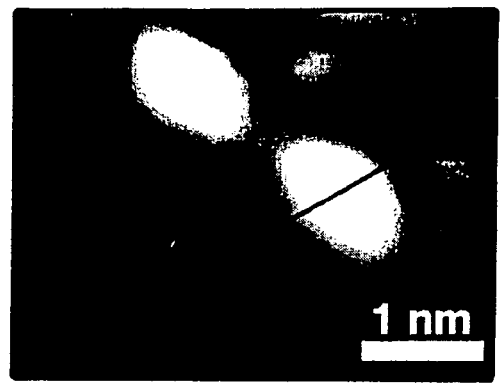

FIGS. 6a and 6b show atomic resolution images of two hydrogen desorption sites ~1.5 nm apart on a dimer row both before and after exposure to phosphine gas. The effectiveness of the hydrogen resist as a barrier to phosphine adsorption is demonstrated by the uniform hydrogen coverage after phosphine dosing except at the previously desorbed hydrogen sites. In order to observe any changes after phosphine exposure we have specifically chosen single hydrogen desorption sites, rather than larger desorption sites (as in FIG. 5) and present high resolution images where the spacing between sites is very small. Here the bright protrusion at each of the desorption sites in FIG. 6a is the signature of the single silicon dangling bond, after desorption of just one hydrogen atom, in this case from the left side of the dimer. The remaining hydrogen on the silicon dimer is known to be transient[27] and we have observed it diffusing from one side of the dimer to the other with time.

Figure 6C:
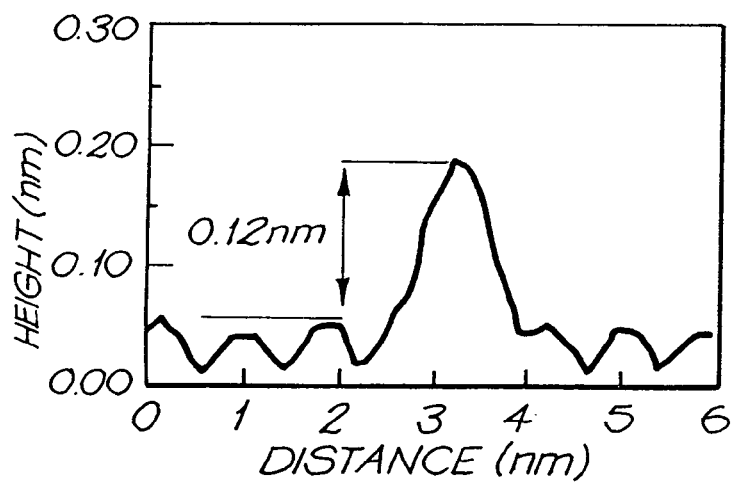
Figure 6D:
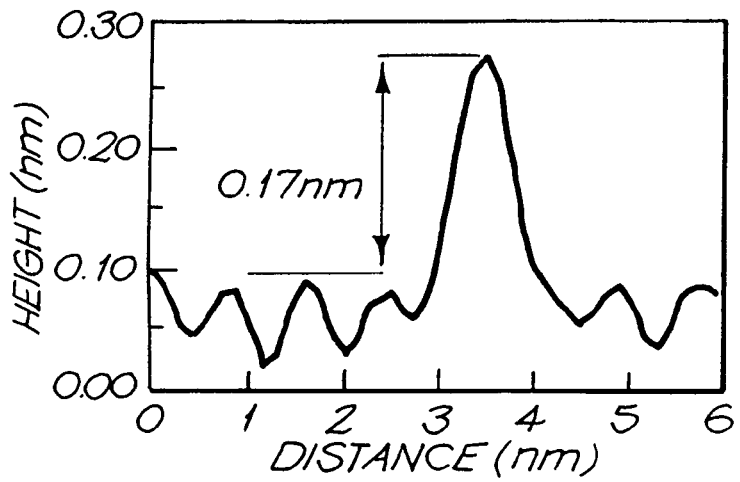

FIG. 6b shows the same area as FIG. 6a after exposure to phosphine gas at room temperature. Analysis of the line profiles in FIGS. 6c and 6d shows a characteristic increase of ~0.05 nm in the height of the protrusion after phosphine dosing. Such a difference can frequently occur due to minor changes in imaging conditions between scans, which results in the STM tip extending further into the gap between dimer rows. However the height difference due to PH$_3$ adsorption is measured from the top of the dimer rows to the top of the protrusion and is not therefore affected by this.

Figure 6E:
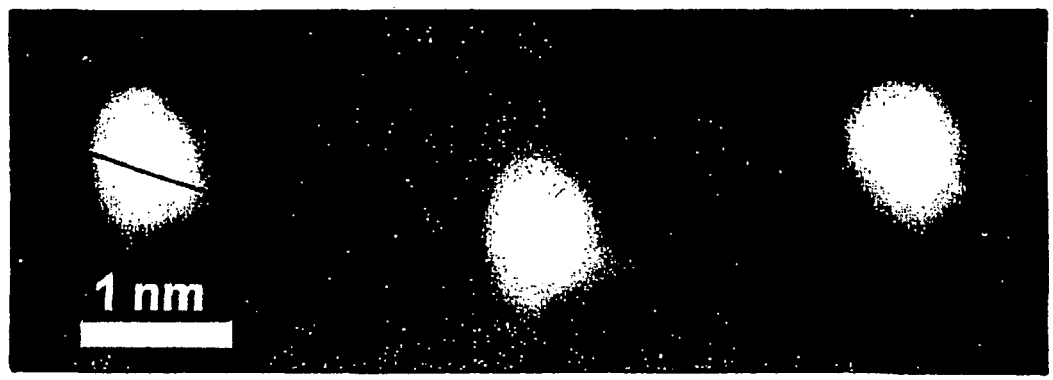
Figure 6F:
Figure 6G:
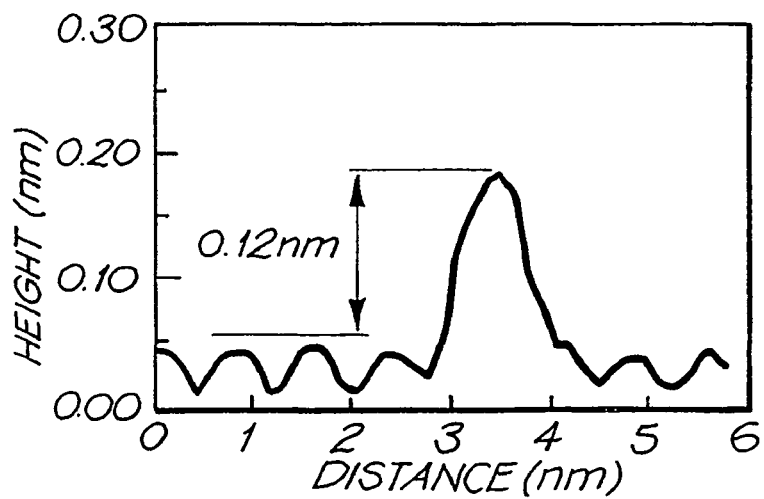
Figure 6H:
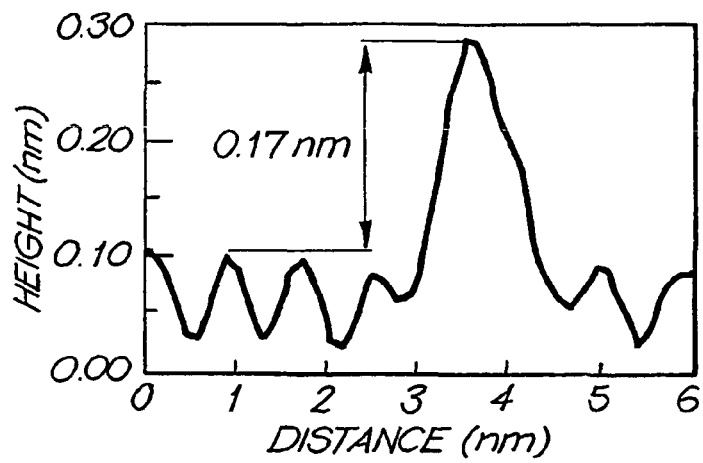

FIGS. 6e and 6f show three desorption sites, in a line perpendicular to the dimer rows, before and after phosphine dosing. The associated line profiles (FIGS. 6g and 6h) again show a ~0.05 nm height increase. This increase, observed at all adsorption sites over several images, was calibrated against an atomic step edge on the same surface (not shown) both before and after phosphine dosing. This reproducible increase confirms the adsorption of a PH$_3$ molecule and corresponds to the difference between the exposed silicon dangling bond and the adsorbed phosphine. The transient nature of the hydrogen atom on the silicon dimer can account for the asymmetry of the final image where one phosphine molecule has bonded to the left silicon in the dimer (upper) and another phosphine molecule has bonded to the right silicon in the dimer (lower).

Figures 7A, 7B:
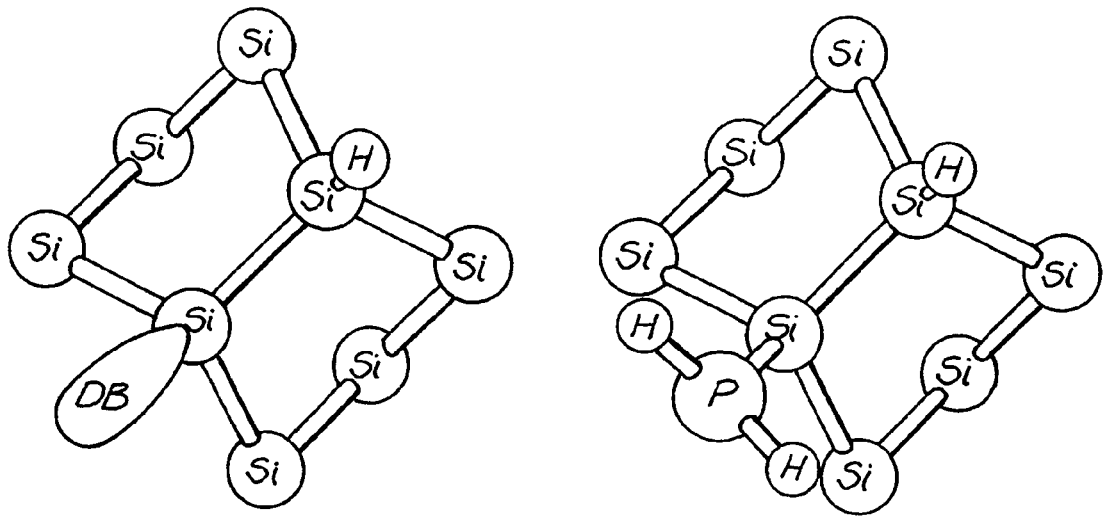
FIG. 7 is a schematic of a single silicon dangling bond (a) and the Si—$PH_2$ structure expected after dissociation of the adsorbed $PH_3$ (b). These models are shown looking down onto the surface, where the two silicon atoms in the centre are surface atoms and the others are sub-surface atoms.

Studies of the interaction of phosphine with clean Si(001) 2×1 surface[25,26,28] suggest that PH$_3$ molecularly adsorbs to one end of a silicon dimer and can then dissociate to PH$_2$ provided silicon dangling bonds are available nearby for the re-adsorption of the dissociated H. The absence of available dangling bond sites on the hydrogen-terminated surface can inhibit this dissociation step. FIG. 7a shows a schematic of a single dangling bond site on a hydrogen terminated surface before phosphine dosing and FIG. 7b shows the proposed structure of Si—PH$_2$, after dissociation of the adsorbed PH$_3$. In this configuration the adsorbed phosphorus atom maintains the tetrahedral geometry and threefold coordination, with the PH$_2$ bonded to one end of the dimer. A similar dissociative process and Si-XH$_2$ configuration is understood to occur in the adsorption of NH$_3$[29] and AsH$_3$[30] on the Si(001)2×1 surface, where both nitrogen and arsenic are isoelectronic with phosphorus.

The above results are important since for the first time we have demonstrated the effectiveness of the hydrogen resist as a barrier to phosphine adsorption and used this technique for the controlled placement of single phosphorus bearing molecules on a silicon surface—a central step in the construction of a silicon based quantum computer. This process, shown for closely-spaced controlled doping, demonstrates the achievability of more widely-spaced (~20 nm), precisely positioned phosphorus qubit arrays over large areas. This fabrication process is also applicable to the production of other micro- or nanoelectronic devices that could utilise ordered atom or dopant arrays.

The final fabrication step, which is not the subject of this patent, is to encapsulate the phosphorus bearing molecules into a silicon crystalline lattice with minimal diffusion of the phosphorus array. Whilst the resulting hydrogen terminated surface is known to be compatible with the subsequent regrowth of silicon by molecular beam epitaxy (MBE)[31,32] the encapsulation of atomically placed dopants in silicon has never been reported.

Finally, it is important to note that the fabrication strategy demonstrated here is also directly applicable to other silicon based quantum computer architectures[18].

The references that have been made throughout the text above are incorporated herein by reference:

1. Kane, B. E. A silicon-based nuclear spin quantum computer. *Nature* 393, 113–137 (1998).
2. Kane, B. E. Patent Application PCT/AU98/00778.
3. Tucker, J. R. and Shen, T. C. Prospects for atomically ordered device structures based on STM lithography. *Solid State Electronics* 42, 1061–1067 (1998).
4. McAlpine, N. S., Kane, B. E., Dzurak, A. S., Clark, R. G., Fabrication Technologies for Solid State Quantum Computational Devices, *Bulletin of the American Physical Society*, 1999 Centennial Meeting, QC41 1 Page 1239.
5. Dzurak, A. S., Kane, B. E., Clark, R. G., McAlpine, N. S., 23$^{rd}$ *Australian-New Zealand Institute of Physics Condensed Matter Physics Meeting, Charles Sturt University, Wagga Wagga, New South Wales*, February 1999.
6. Shen, T. C., Wang, C., Abeln, G. C., Tucker, J. R., Lyding, J. W., Avouris, Ph., Walkup, R. E. Atomic-Scale desorption through electronic and vibrational excitation mechanisms. *Science* 268, 1590–1592 (1995).
7. Huang, D., Yamamoto, Y. Si dimer chain on Si(100)–2×1:H surface fabricated by scanning tunneling microscope. *Jpn. J. Appl. Phys*. 35, 3734–3737 (1996).
8. Lyding, Joseph W. UHV STM Nanofabrication: Progress, Technology Spin-Offs, and Challenges. *Proceedings of the IEEE*, Vol. 85, No. 4, April 1997.
9. Hitosugi, Taro, Hashizume, T., Heike, S., Kajiyama, H., Wada, Y., Watanabe, S., Hasegawa, T., Kitazawa, K. Scanning tunneling microscopy/spectroscopy of dangling-bond wires fabricated on the Si(100)2×1:H surface. *Applied Surface Science* 130–132 (1998) 340–345.
10. Stokbro, K., Thirstrup, C., Sakurai, M., Quaade, U., Ben Yu-Kuang Hu, Perez-Murano, F., Grey, F. STM-induced hydrogen desorption via a hole resonance. *Phys. Rev. Lett*. 80, 2618–2621 (1998).
11. Syrykh, C., Nys, J. P., Legrand, B., Stievenard, D. Nanoscale desorption of H-passivated Si(100)–2×1 surfaces using an ultrahigh vacuum scanning tunneling microscope. *J. Appl. Phys*. 85, 3887–3892 (1999).

12. Lyding, J. W., Abeln, G. C., Shen, T. C., Wang, C., and Tucker, J. R. Nanometer scale patterning and oxidation of silicon surfaces with an ultra-high vacuum tunnelling microscope. *J. Vac. Sci. Technol. B* 12, 3735 (1994).
13. Adams, D. P., Mayer, T. M., and Swartzentruber, B. S. Nanometer-scale lithography on Si(100) using adsorbed H as an atomic layer resist. *J. Vac. Sci. Technol. B* 14, 1642 (1997).
14. Shen, T. C., Wang, C., and Tucker, J. R. Al nucleation on monohydride and bare Si(001) surfaces: atomic scale patterning. *Phys. Rev. Lett.* 78, 1271 (1997).
15. Hashizume, T., Heike, S., Lutwyche, M. I., Watanabe, S, and Wada, Y. Atom structures on the Si(100) surface. *Surface Science* 386, 161 (1997).
16. Palasantzas, G., Ilge, B., De Nijs, J., and Geerigs, L. J. Fabrication of Co/Si nanowires by ultra-high vacuum scanning tunnelling microscopy on hydrogen-passivated Si(100) surfaces. *J. Appl. Phys.* 185, 1907 (1999).
17. Sakurai, M., Thirstrup, C., and Aono, M. Nanoscale growth of silver on patterned hydrogen terminated Si(100) surfaces. *Phys. Rev. B* 62, 16167 (2000).
18. Vrijen, R., Yablonovitch, E., Kang Wang, Hong Wen Jiang, Balandin, A., Roychowdhury, V., Mor, T., DiVincenzo, D. Electron-spin-resonance transistors for quantum computing in silicon-germanium heterostructures. *Phys. Rev. A* 62, 012306/1–10 (2000).
19. Swartzentruber, B. S., Mo, Y. W., Webb, M. B. & Lagally, M. G. Scanning tunneling microscopy studies of structural disorder and steps on Si surfaces. *J. Vac. Sci. Tech. A* 7, 2901–2905 (1989).
20. Hata, K., Kimura, T., Ozawa, S. and Miyamoto, N. How to fabricate a defect free surface. *J. Vac. Sci. Technol. A* 18, 1933 (2000).
21. Hata, K., Yasuda, S. and Shigekawa, H. Reinterpretation of the scanning tunneling microscopy images of the Si(100)2×1 dimers. *Phys. Rev. B.* 60, 8164 (1999).
22. Oura, K., Lifshits, V. G., Saranin, A. A., Zotov, A. V. & Katayama, M. Hydrogen interaction with clean and modified silicon surfaces. *Surf. Sci. Rep.* 35, 1–69 (1999).
23. Hamers, R. J., Avouris, Ph. & Bozso, F. Imaging of chemical-bond formation with the scanning tunneling microscope. $NH_3$ dissociation on Si(001) *Phys. Rev. Left.* 59, 2071–2074 (1987).
24. Thirstrup, C., private communication
25. Wang, Y., Bronikowski, M. J. & Hamers, R. J. An atomically-resolved STM study of the interaction of phosphine ($PH_3$) with the silicon (001) surface. *J. Phys. Chem.* 98, 5966–5973 (1994).
26. Lin, D. S., Ku, T. S., and Chen, R. P. Interaction of phosphine with Si(100) from core-level photoemission and real-time scanning tunneling microscopy *Phys. Rev. B* 61, 2799 (2000).
27. Hill, E., Freelon, B., Ganz, E. Diffusion of hydrogen on the Si(001) surface investigated by STM atom tracking. *Phys. Rev. B* 60, 15896–15900 (1999).
28. Wang, Y., Chen, X. and Hamers, R. J., Atomic-resolution study of overlayer formation and interfacial mixing in the interaction of phosphorus with Si(001) *Phys. Rev. B* 50, 4534 (1994).
29. Zhi-Heng Loh, Kang, H. C. Chemisorption of $NH_3$ on Si(100)2×1: A study by first-principles ab initio and density functional theory. *J. Chem. Phys.* 112, 2444–2451 (2000).
30. Northrup, J. E. Theoretical studies of arsine adsorption on Si(100). *Phys. Rev. B* 51, 2218–2222 (1995).
31. Copel, M., and Tromp, R. M. H Coverage Dependence of Si(100) Homoepitaxy. *Phys. Rev. Letters* 72, 1236–1239 (1994).
32. Eaglesham, D. J., Gossman, H. J., and Cerullo, M. Limiting thickness for epitaxial growth and room temperature silicon growth on Si(100). *Phys. Rev. Letters* 65, 1227–1231 (1990).

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A nanoscale product, comprising:
an array of single phosphorus bearing molecules adsorbed onto a hydrogen patterned crystalline silicon surface; where the hydrogen patterned crystalline silicon surface comprises a mono layer of hydrogen from which hydrogen atoms have been singly desorbed in a controlled manner to expose less than or equal to two silicon dimers such that single phosphorous bearing molecules can adsorb to the exposed underlying silicon dangling bond site.

2. A nanoscale product according to claim 1 where the nanoscale product is a quantum computer involving the use of the nuclear spin or electron spin of donor atoms as the qubits embedded in isotopically pure $^{28}Si$ (I=0), the computer, including:
a Si(001)2×1 substrate into which single donor bearing molecules have been adsorbed through respective windows in a resist, being a mono layer of hydrogen, to create an array, where each window is sized by the desorption of hydrogen to permit only one donor bearing molecule to adsorb to the silicon at that site, where these sites are separated from each other by a spacing such as that the wave functions of adjacent pairs of donor electrons overlap.

3. A method of fabricating a nanoscale product according to claim 1, comprising the following steps:
(a) preparing a sample Si(001)2×1 surface in an ultra-high-vacuum environment by:
(iv) outgassing the samples for 6 hours at ~600° C. by indirect heating such as using a resistive heating element mounted behind the sample holder,
(v) flashing the samples to ~1200° C. for ~1 minute by passing a DC current directly through the sample, during which time pressure remains in the low $10^{-10}$ mbar region,
(vi) reducing the sample temperature to ~950° C. and then cooling slowly from ~950° C. to room temperature;
(b) passivating the sample surface with atomic hydrogen in the same ultra-high-vacuum environment, the dose rate being controlled by monitoring the total pressure of the vacuum system to achieve hydrogen termination of the surface, being a mono layer of hydrogen;
(c) selectively desorbing single H atoms from the passivated surface using an STM tip in the same ultra-high-vacuum environment, by applying pulses of both high voltage and tunneling current to the tip for a short time period of the order 1 ms, to form a pattern in the hydrogen layer; and
(d) exposing the surface to phosphine ($PH_3$) molecules in the same ultra-high-vacuum environment, such that the phosphine molecules bond to the exposed pattern in the surface.

4. A method of fabricating a nanoscale product, which comprises an array of single phosphorous bearing molecules adsorbed onto a hydrogen patterned crystalline silicon surface; where the hydrogen patterned crystalline silicon comprises a mono layer of hydrogen from which hydrogen atoms have been singly desorbed to expose regions for the single phosphorous bearing molecule to adsorb onto; and where the method comprises the following steps:

(a) preparing a sample Si(001)2×1 surface in an ultra-high-vacuum environment by:
  (iv) outgassing the samples for 6 hours at ~600° C. by indirect heating such as using a resistive heating element mounted behind the sample holder,
  (v) flashing the samples to ~1200° C. for ~1 minute by passing a DC current directly through the sample, during which time pressure remains in the low $10^{-10}$ mbar region,
  (vi) reducing the sample temperature to ~950° C. and then cooling slowly from ~950° C. to room temperature;

(b) passivating the sample surface with atomic hydrogen in the same ultra-high-vacuum environment, the dose rate being controlled by monitoring the total pressure of the vacuum system to achieve hydrogen termination of the surface, being a mono layer of hydrogen;

(c) selectively desorbing single H atoms from the passivated surface using an STM tip in the same ultra-high-vacuum environment, by applying pulses of both high voltage and tunneling current to the tip for a short time period of the order 1 ms, to form a pattern in the hydrogen layer; and (d) exposing the surface to phosphine ($PH_3$) molecules in the same ultra-high-vacuum environment, such that the phosphine molecules bond to the exposed pattern in the surface.

* * * * *